United States Patent
Finlay et al.

(10) Patent No.: US 10,372,698 B2
(45) Date of Patent: *Aug. 6, 2019

(54) OPTIMIZATION OF METADATA VIA LOSSY COMPRESSION

(71) Applicant: International Business Machines Corporation, Armonk, NY (US)

(72) Inventors: Ian R. Finlay, Uxbridge (CA); Christian M. Garcia-Arellano, Richmond Hill (CA); Adam J. Storm, Toronto (CA); Calisto P. Zuzarte, Pickering (CA)

(73) Assignee: International Business Machines Corporation, Armonk, NY (US)

( * ) Notice: Subject to any disclaimer, the term of this patent is extended or adjusted under 35 U.S.C. 154(b) by 306 days.

This patent is subject to a terminal disclaimer.

(21) Appl. No.: 14/737,715

(22) Filed: Jun. 12, 2015

(65) Prior Publication Data
US 2016/0179896 A1    Jun. 23, 2016

Related U.S. Application Data

(63) Continuation of application No. 14/575,425, filed on Dec. 18, 2014.

(51) Int. Cl.
*H03M 7/30* (2006.01)
*G06F 16/22* (2019.01)
(Continued)

(52) U.S. Cl.
CPC ........ *G06F 16/2282* (2019.01); *G06F 16/215* (2019.01); *G06F 16/24561* (2019.01); *G06F 16/24573* (2019.01); *H03M 7/3059* (2013.01)

(58) Field of Classification Search
CPC ......... G06F 17/30339; G06F 17/30303; G06F 17/30501; G06F 17/30525; G06F 16/2282;
(Continued)

(56) References Cited

U.S. PATENT DOCUMENTS

| 8,332,367 B2 | 12/2012 | Bhattacherjee et al. |
| 8,386,444 B2 * | 2/2013 | Kraus ............... G06F 17/30339 707/693 |

(Continued)

FOREIGN PATENT DOCUMENTS

WO    2013152678 A1    10/2013

OTHER PUBLICATIONS

"Scan Optimization Using Bloom Filter Synopsis", U.S. Appl. No. 14/947,506, 50 Pages, filed Nov. 20, 2015.
(Continued)

*Primary Examiner* — Mark D Featherstone
*Assistant Examiner* — Faezeh Forouharnejad
(74) *Attorney, Agent, or Firm* — Christopher K. McLane; Daniel R. Simek

(57) ABSTRACT

The method includes identifying at least one of a minimum value, a maximum value, and a Bloom filter value for a row of data in a metadata table, wherein the metadata table contains metadata corresponding to a row of data in a main table. The method includes adjusting at least one of an identified first minimum value to a second minimum value, an identified first maximum value to a second maximum value, and an identified first Bloom filter value to a second Bloom filter value.

9 Claims, 6 Drawing Sheets

(51) Int. Cl.
*G06F 16/215* (2019.01)
*G06F 16/2455* (2019.01)
*G06F 16/2457* (2019.01)

(58) Field of Classification Search
CPC ............. G06F 16/215; G06F 16/24561; G06F 16/24573; H03M 7/3059
See application file for complete search history.

(56) References Cited

U.S. PATENT DOCUMENTS

| | | | |
|---|---|---|---|
| 8,423,275 B1 | 4/2013 | Kandal | |
| 8,549,004 B2* | 10/2013 | Lakshminarayan | ........................ G06F 17/30469 707/737 |
| 2001/0047360 A1 | 11/2001 | Huras et al. | |
| 2004/0220908 A1* | 11/2004 | Finlay | ................ G06F 17/30448 |
| 2006/0068889 A1* | 3/2006 | Okada | ..................... G07F 17/32 463/20 |
| 2006/0106777 A1* | 5/2006 | Faunce | ............. G06F 17/30469 |
| 2008/0059412 A1 | 3/2008 | Tarin | |
| 2008/0071818 A1 | 3/2008 | Apanowicz et al. | |
| 2009/0031044 A1 | 1/2009 | Barrack et al. | |
| 2009/0037500 A1 | 2/2009 | Kirshenbaum | |
| 2010/0082648 A1 | 4/2010 | Potapov et al. | |
| 2010/0191884 A1 | 7/2010 | Holenstein et al. | |
| 2010/0257181 A1 | 10/2010 | Zhou et al. | |
| 2011/0029569 A1 | 2/2011 | Ganesh | |
| 2011/0113048 A1 | 5/2011 | Njemanze | |
| 2011/0153861 A1 | 6/2011 | Chauhan | |
| 2011/0208703 A1 | 8/2011 | Fisher et al. | |
| 2011/0258225 A1 | 10/2011 | Taylor et al. | |
| 2012/0197866 A1* | 8/2012 | Xu | ..................... G06F 17/30412 707/713 |
| 2012/0303627 A1* | 11/2012 | Keeton | ............. G06F 17/30536 707/741 |
| 2013/0132408 A1 | 5/2013 | Little | |
| 2015/0095299 A1 | 4/2015 | Dickie et al. | |
| 2015/0095379 A1 | 4/2015 | Dickie et al. | |
| 2017/0308572 A1 | 10/2017 | Finlay et al. | |
| 2018/0107710 A1 | 4/2018 | Finlay | |

OTHER PUBLICATIONS

"Scan Optimization Using Bloom Filter Synopsis", CA Application No. 2876466, 50 Pages, filed Dec. 29, 2014.
"Automatically Revising Synopsis Table Structure", U.S. Appl. No. 15/094,213, 42 Pages, filed Apr. 8, 2016.
"Pruning of Columns in Synopsis Tables", U.S. Appl. No. 15/138,637, 38 Pages, filed Apr. 26, 2016.
Appendix P, List of IBM Patents or Patent Applications Treated as Related, 2 pages, dated Jun. 2, 2016.
Adali, et al., "Query Caching and Optimization in Distributed Mediator Systems", SIGMOD '96 Proceedings of the 1996 ACM SIGMOD International Conference on Management of Data pp. 137-146, <http://ilpubs.stanford.edu:8090/86/2/1995-1.pdf>.
Chang, et al., "Bigtable: A Distributed Storage System for Structured Data", Google, Inc., To appear in OSDI 2006, <http://static.googleusercontent.com/media/research.google.com/en//archive/bigtable-osdi06.pdf>.
Jagadish, et al., "ItCompress: An Iterative Semantic Compression Algorithm", Data Engineering, 2004, Proceedings 20th International Conference, IEEE, <http://www.comp.nus.edu.sg/~ooibc/itcompress.pdf>.
Raman, et al., "DB2 with BLU Acceleration: So Much More than Just a Column Store", Proceedings of the VLDB Endowment, vol. 6, No. 11, Aug. 26-30, 2013, Copyright 2013 VLDB Endowment.
"Bloom Filters—Hypertable—A high performance, scalable, distributed storage and processing system for structured and unstructured data", Google Inc., Updated Feb. 4, 2010, <http://code.google.com/hypertable/wiki/BloomFilters>.
"Bloom Filter", From Wikipedia, the free encyclopedia, Updated Dec. 3, 2013, <http://en.wikipedia.org/w/index.php?title=Bloom_filter&oldid=584413989>.
List of IBM Patents or Patent Applications Treated as Related, Filed Herewith.
Ian R. Finlay, et al., "Optimization of Metadata Via Lossy Compression", U.S. Appl. No. 14/575,425, filed Dec. 18, 2014.
Appendix P, List of IBM Patents or Patent Applications Treated As Related, 2 pages, dated Jan. 8, 2018.
Finlay et al., "Pruning of Columns in Synopsis Tables", U.S. Appl. No. 15/845,246, filed Dec. 18, 2017, 33 pages.

* cited by examiner

OPTIMIZATION OF METADATA VIA LOSSY COMPRESSION

BACKGROUND OF THE INVENTION

The present invention relates generally to compressing data, and more particularly to lossy compression.

In information technology, "lossy" compression is the class of data encoding methods that uses inexact approximations (or partial data discarding) for representing the content that has been encoded. Such compression techniques are used to reduce the amount of data that would otherwise be needed to store, handle, and/or transmit the represented content. The amount of data reduction possible using lossy compression can often be much more substantial than what is possible with lossless data compression techniques.

Using well-designed lossy compression technology, a substantial amount of data reduction is often possible before the result is sufficiently degraded to be noticed by the user. Even when the degree of degradation becomes noticeable, further data reduction may often be desirable for some applications (e.g., to make real-time communication possible through a limited bit-rate channel, to reduce the time needed to transmit the content, or to reduce the necessary storage capacity).

A Bloom filter is a space-efficient probabilistic data structure conceived by Burton Howard Bloom in 1970 that is used to test whether an element is a member of a set. False positive matches are possible but false negatives are not; thus, a Bloom filter has a 100% recall rate. In other words, a query returns either "possibly in set" or "definitely not in set." Elements can be added to the set but not removed (though this can be addressed with a "counting" filter). The more elements that are added to the set, the larger the probability of false positives.

SUMMARY

Embodiments of the present invention disclose a method for adjusting metadata in tables. In one embodiment, in accordance with the present invention, the computer-implemented method includes determining the similarity of topics. The method further includes identifying at least one of a minimum value, a maximum value, and a Bloom filter value for a row of data in a metadata table, wherein the metadata table contains metadata corresponding to a row of data in a main table. The method further includes generating an in-memory structure, wherein the in-memory structure corresponds to a column of data in the main table and the corresponding metadata from the metadata table, and wherein the in-memory structure monitors at least one of a number of times a predicate is used, a type of predicate used, and the frequency of use of the metadata table for a predicate in the corresponding main table. The method further includes adjusting at least one of an identified first minimum value to a second minimum value, an identified first maximum value to a second maximum value, and an identified first Bloom filter value to a second Bloom filter value in the metadata table.

DETAILED DESCRIPTION

Embodiments of the present invention recognize that it may be desirable for dictionary encoding of metadata tables, also referred to as index tables, to be used to achieve a reduction in space. If a very low number of distinct values are in a column, the minimum value, maximum value, and Bloom value will have recurring patterns that are compressed more easily.

Implementation of embodiments of the invention may take a variety of forms, and exemplary implementation details are discussed subsequently with reference to the Figures.

Figure 1:
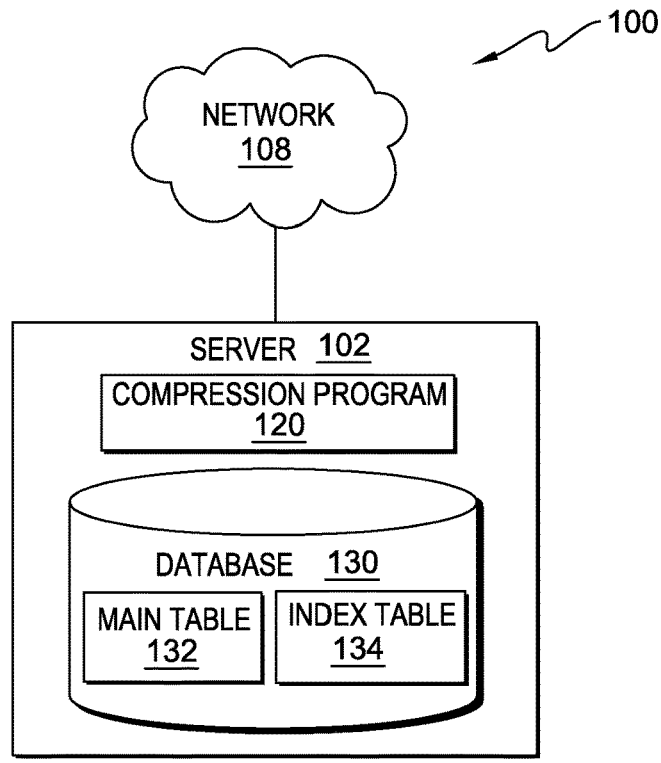
FIG. 1 is a functional block diagram illustrating a distributed data processing environment, in accordance with an embodiment of the present invention.

FIG. 1 is a functional block diagram illustrating a distributed data processing environment, generally designated 100, in accordance with one embodiment of the present invention. FIG. 1 provides only an illustration of one implementation and does not imply any limitations with regard to the environments in which different embodiments may be implemented. Many modifications to the depicted environment may be made by those skilled in the art without departing from the scope of the invention as recited by the claims.

Distributed data processing environment 100 includes server 102, which is connected to network 108. Network 108 represents, for example, a telecommunications network, a local area network (LAN), a wide area network (WAN), such as the Internet, or a combination of the three, and includes wired, wireless, and/or fiber optic connections. Network 108 includes one or more wired and/or wireless networks that are capable of receiving and transmitting data, voice, and/or video signals, including multimedia signals that include voice, data, and video information.

In the depicted environment, server 102 is one or more of a management server, a web server, or any other electronic device or computing system capable of receiving and sending data. In other embodiments, server 102 represents a server computing system utilizing multiple computers as a server system, such as in a cloud computing environment. In another embodiment, server 102 represents a laptop computer, a tablet computer, a netbook computer, a personal computer (PC), a desktop computer, a personal digital assistant (PDA), a smart phone, or any programmable electronic device capable of communicating with network 108. In another embodiment, server 102 represents a computing system utilizing clustered computers and components to act as a single pool of seamless resources. Server 102 includes compression program 120 and database 130. Server 102 may include components, as depicted and described in further detail with respect to FIG. 6, in accordance with embodiments of the present invention.

In the depicted embodiment, database 130 resides on server 102. In another embodiment, database 130 may reside elsewhere in distributed data processing environment 100, such as independently as a standalone database that is capable of communicating with server 102 via network 108. A database is an organized collection of data. Database 130 is implemented with any type of storage device capable of storing data that is accessed and utilized by server 102, such as a database server, a hard disk drive, or a flash memory. In other embodiments, database 130 represents multiple storage devices within server 102. Database 130 stores information, such as large charts which require large amounts of data to be read from the charts to answer analytical queries; auxiliary summary tables that provide minimum, maximum; and Bloom values of columns of the main charts that have been aggregated over a block of rows, clusters of data, compressed data, etc. A Bloom value is a way of storing data in bits of either 0 or 1. Database 130 contains main table 132 and index table 134. Database 130 may include components, as depicted and described in further detail with respect to FIG. 6, in accordance with embodiments of the present invention.

Figure 6:
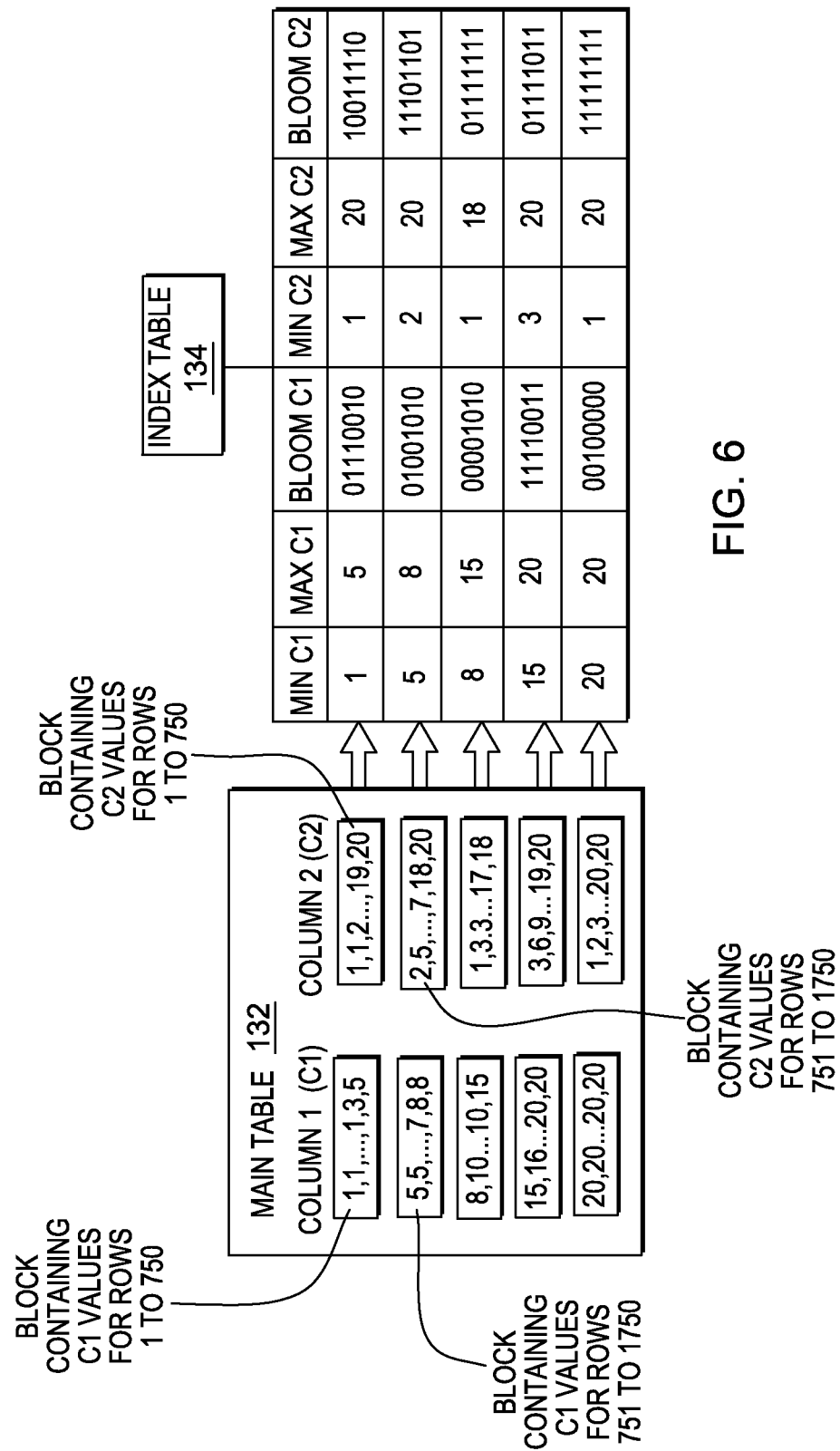
FIG. 6 is a block diagram illustrating a main table with blocks of data or data within a page and metadata tables containing minimum values, maximum values, and Bloom values corresponding to the blocks of data or data within a page, in accordance with an embodiment of the present invention.

In the depicted embodiment, main table 132 is a large collection of data stored in database 130. In an example, main table 132 may comprise thousands or millions of rows and several columns. In an example, data stored in a main table may comprise dates, locations, dates of birth, telephone numbers, pictures, audio files, etc. In an embodiment, the data from a main table (e.g., main table 132) may be broken up into blocks of data (e.g., 1000 rows of a chart), and each block may have a corresponding row in an index table. Main table 132 in FIG. 6 depicts a sample portion of data that may be in main table 132, such as column 1 (C1) and column 2 (C2). In an example, a row may be stored in pages or blocks that comprise multiple rows and multiple columns. In another embodiment, individual columns of data may be stored separately in blocks or pages, such as the depicted five blocks of data in columns C1 and C2 depicted in FIG. 6. In FIG. 6, the first block containing C1 values for rows 1 to 750 contains 750 values of the first 750 rows in the main table for column 2. The block containing C2 values for rows 1 to 750 also contains 750 values of the first 750 rows in main table 132 for column 2. The second block containing C1 values for rows 751 to 1750 contains the next 1000 values for C1 in the main table. Similarly, the second block containing C2 values for rows 751 to 1750 contains the next 1000 values for C2 in main table 132. The third block could contain the next 1000 values and so on. The number does not need to be fixed, and the blocks are created when data is inserted in the table. FIG. 6 depicts five blocks each for columns C1 and C2.

In the depicted embodiment, index table 134 is a collection of metadata that relates to large blocks of data in a main table (e.g., main table 132). Rows in the index table correspond to blocks of rows in the main table as depicted in FIG. 6. Rows of index table 134 contain information about what is not in the block of rows of the main table. For example, C1 contains a thousand entries number ranging from 5 to 8. To further the example, in main table 132, the second block of data in column C1 has corresponding rows in index table 134 comprising metadata indicating that numbers less than 5 and greater than 8 are not in the second block of data of column C1 from the main table. In some embodiments there may be a minimum row, a maximum row, and a Bloom row in the index table for each block of data in the main table.

In another example, index table 134 may have a Bloom value that correlates to values in main table 132. In an example, where a column can contain only two values 'M' and 'F' for Male and Female, a hash function is used to set bits in the Bloom filter. In this example, if a 6 bit Bloom value was used in the index table, the hash function might result in a hash value of 3 for male and 1 for female. The Bloom value has bit 3 set to 1 if any column value within a block is 'M', and the Bloom value has bit 1 set to 1 if any column value within the block is 'F'. The Bloom value only has two possible bits in the index table, and the corresponding block of data in the main table may have been entered as to keep all females together or all males together, which would result in the Bloom value being all 1's or all 0's in bit positions 1 and 3. In one example, a Bloom value in the index table corresponding to a block of data in the main table, which has a mixture of males and females may look like (101000). In another example, a Bloom value in the index table in which the main table page or block has just males in the column data may look like (001000). In yet another example, when there are females, the first bit would be a 1. Since there is no 1 in the first space, the index table indicates that there are no females in the corresponding page or block of data in the main table. Bloom filters predict absence of data for equality predicates not range predicates unlike minimum and maximum values. For example, in a block of data in a main table there may be four of a possible fifty states within a country. All four states may have their own bit; and therefore, that bit would indicate that the corresponding state value is in the data in the corresponding block of data in the main table. In various examples, two values may share the same bit (e.g., the name Dan and the name Mary may both hash to the same value and share the 5th bit in a 32 bit Bloom filter). In an example in which two values share the same bit, if the index table (e.g., index table 134) shows a value of the $5^{th}$ bit as 0, the value indicates that neither Dan nor Mary are in the corresponding row in the main table (e.g., main table 132).

In depicted distributed data processing environment 100, compression program 120 resides on server 102 and optimizes the storage of an index table (e.g., index table 134). In various embodiments, compression program 120 compresses index tables by using a frequency-based compression dictionary for the data in each column of an index table. As more values are repeated in an index table column, compression program 120 can compress the data in the index table more. Compression program 120 may adjust the maximum, minimum, and Bloom filter index table columns corresponding to each main table column. In an embodiment, index tables (e.g., index table 134) containing rows with the minimum, maximum, and Bloom filter for values in a block of data from a main table (e.g., main table 132) may contain pages or blocks of data in a table in a relational database system where the index table (e.g., index table 134) is used to skip over blocks of the main table (e.g., main table 132) during a scan of the main table.

In one embodiment, compression program 120 identifies index tables (e.g., index table 134) to compress in a database (e.g., database 130) and by utilizing lossy compression on minimum, maximum, and Bloom values compresses the data in the index table. In this embodiment, the index tables being compressed contain metadata that provide a synopsis of what does not correspond to a block of data in a main table (e.g., main table 132). For example, the table may contain metadata. The metadata comprises information related to pages or blocks of data in charts or tables in a large database (e.g., database 130). The metadata information allows the database system to eliminate reading pages or blocks of data from the main table.

In an example, if a database system (not depicted) is searching a database for information, the database system can reference the tables, and the database system searches an index table as it allows for the elimination of large portions of data to search. For example, a database system is searching for a phone number with a specific area code in one million entries in a main table. The database system actually searches the corresponding index tables. Metadata in the index table indicates that the specific area code is not in the first block of one thousand entries. Meta data may further indicate that the specific area code may be in the second block of one thousand entries. The index table (e.g., index table 134) indicates that the specific area code is within the minimum, maximum, or possibly has the corresponding bit set in the Bloom value for the column in row two of the index table corresponding to the second block of data in the main table. In various embodiments, compression program 120 compresses minimum, maximum, and/or Bloom values in an index table. Compression program 120 is depicted and described in further detail with respect to FIGS. 2, 3, 4, and 5.

Figure 2:
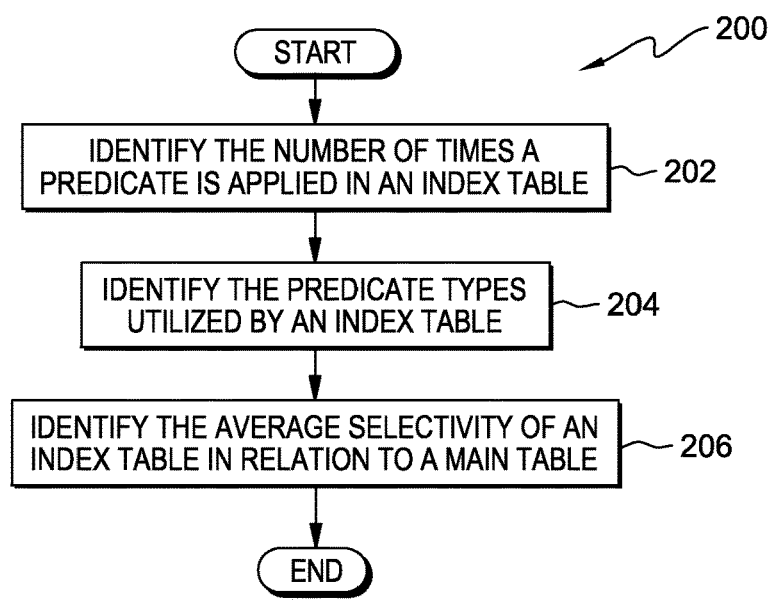
FIG. 2 is a flowchart depicting operational steps of a program for collecting statistics for all predicate types within the distributed data processing environment of FIG. 1, in accordance with an embodiment of the present invention.

FIG. 2 is a flowchart depicting operational steps of program 200, which is a function of compression program 120, in accordance with an embodiment of the present invention. Program 200 operates on server 102 and collects the statistics for all predicate types (e.g., =, IN, >=, <=, >, <, etc.). In various embodiments, program 200 begins the operational steps of program 200 via a user command, an automatic maintenance agent, or a database maintenance policy. Program 200 identifies the number of times a predicate is applied in an index table for a corresponding main table column, the predicate types in an index table for the corresponding main table column, and the percentage of data not used in the index table for the corresponding main table column. In one embodiment, program 200 maintains an in-memory structure to keep track of how the index table is used. In an example, an in-memory structure may comprise Stuct1 (Pred_Type, Count, Avg_Selectivity) for each column.

Program 200 identifies the number of times a predicate is applied in an index table (step 202). In an embodiment, program 200 identifies the number of times a predicate is applied in an index table (e.g., index table 134) that corresponds to a main table (e.g., main table 132) and stores the number of times the predicate is used in an in-memory structure, which is located in a database (e.g., database 130). In another embodiment, the count filed in Stuct1 (e.g., the number of times a predicate is applied in an index table which is stored in an in-memory structure called Struct1) may be updated each time a predicate of a particular type warrants the use of the index table.

Program 200 identifies the predicate types utilized by an index table (step 204). In an embodiment, the predicate type field (e.g., Pred_Type) may keep track of the predicate types which utilize the index table (e.g., index table 134). In an example, the predicate type field (e.g., Pred_Type) may be an equality, an IN predicate type, an OR predicate type, or a range predicate type. In one embodiment, the predicate type (e.g., Pred_Type) is a set of bit flags that may be updated to 1 depending on the predicate type, such as C1 relop const (e.g., where relop is =, IN, >=, <=, <, >, etc.). In an example, program 200 will set the bits for both >= and <= in between predicates. In another example, program 200 treats IN predicates as multiple equality predicates. In various examples, program 200 handles each sub term as an independent simple equality or range predicate when OR predicates have all the sub terms decomposed.

Program 200 identifies the average selectivity of an index table in relation to a main table (step 206). In an embodiment, program 200 identifies the average selectivity (e.g., Avg_Selectivity) to keep track of the effectiveness of the index table (e.g., index table 134) on a corresponding column in the main table (e.g., main table 132) after testing a predicate against the maximum, minimum, and/or Bloom value in the index table (e.g., index table). In an example, for a single predicate, the selectivity of index table 134 is calculated by program 200, wherein program 200 creates a ratio of the number of blocks in main table 132 that need to be read to the total number of blocks in main table 132. In this example, Avg_Selectivity is the average selectivity that is calculated by program 200 over a number of queries that contain a predicate on a column of main table 132, which uses index table 134.

In an embodiment, program 200 may write Struct1 to disk periodically (e.g., one hour) without the need to have the most up-to-date information. In this embodiment, during database stop time, the information may be flushed to disk. In one example, over a period of time, such as a month, the information is used to modify an index table (e.g., index table 134) automatically. In an embodiment, the in-memory structure may be stored in database 130.

Figure 3:
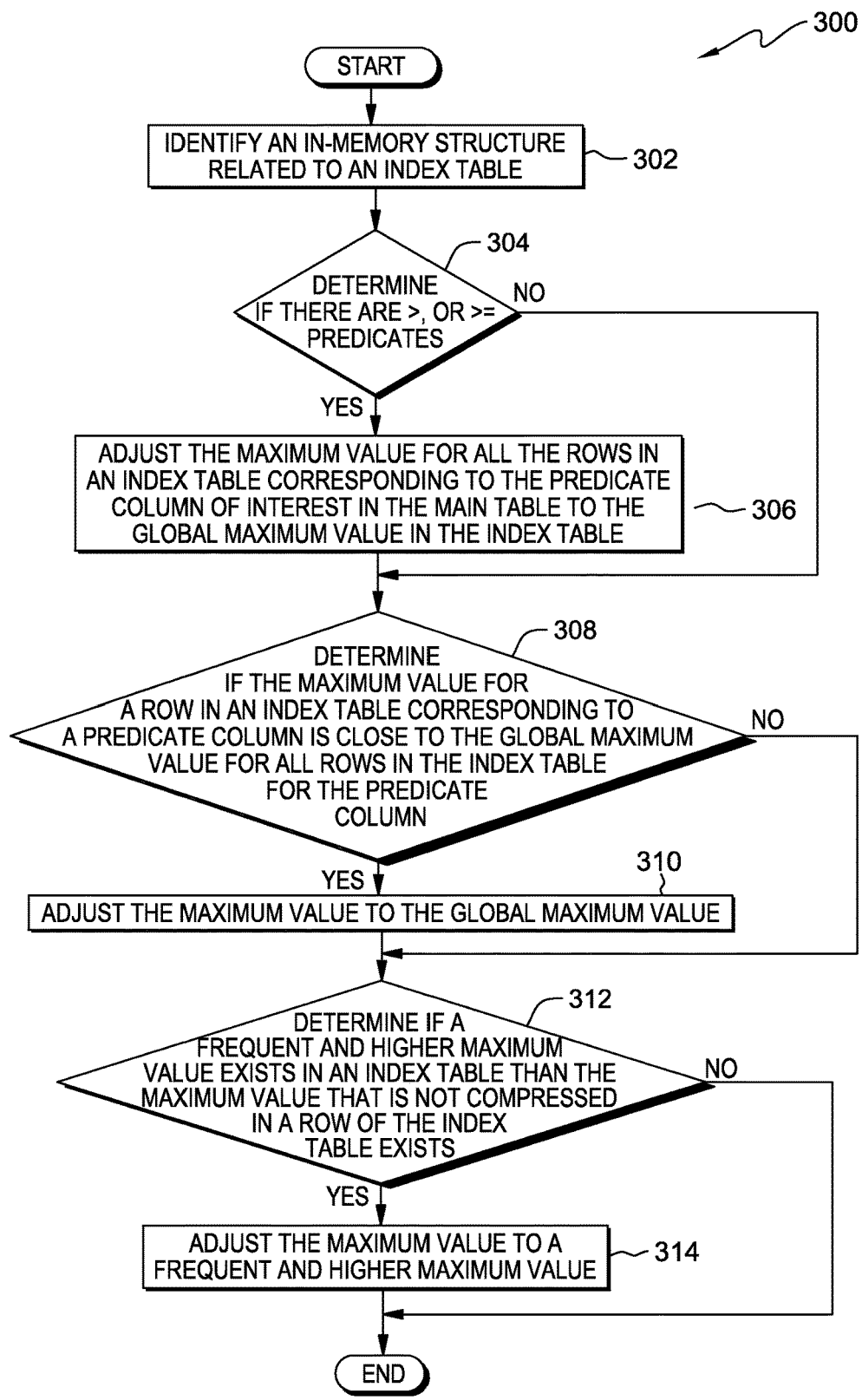
FIG. 3 is a flowchart depicting operational steps of a program for compressing tables containing metadata with maximum values related to large blocks of column data by lossy compression within the distributed data processing environment of FIG. 1, in accordance with an embodiment of the present invention.

FIG. 3 is a flowchart depicting operational steps of program 300, which is a function of compression program 120, in accordance with an embodiment of the present invention. Program 300 operates on server 102 and compresses maximum values on index tables. Program 300 optimizes the storage and read costs of index tables containing rows with a maximum value for corresponding values in a page or block of data in the main table in a relational database system. The method of optimizing storage of the index table is done through using statistics of query predicates and the index table's usage maintained by program 200 and making adjustments of the maximum value to get better index table compression using the encoded values in the index table dictionary. In various embodiments, program 300 begins the operational steps of program 300 via a user command, an automatic maintenance agent, a database maintenance policy, or after an update from program 200.

Program 300 identifies an in-memory structure related to an index table (step 302). In an embodiment, program 300 identifies an in-memory structure for an index table (e.g., index table 134) that relates to maximum values of a block of data in the index table. In an example, an in-memory structure may comprise Stuct1 (Pred_Type, Count, Avg_Selectivity) for each column, where the predicate type is >, or >=. Program 300 identifies the use of the maximum values of a block in the index table.

Program 300 determines if there are > or >= predicates (decision 304). In an embodiment, program 300 determines if there are no >= predicates on a column (e.g., C1>=20) as maintained by program 200 over a configured period of time. If program 300 determines that the maximum value, > or >=, in the index table is used, then program 300 goes to decision 308 (no branch, decision 304).

If program 300 determines that the maximum value in a row of the index table is not used (yes branch, decision 304), then program 300 adjusts the maximum value for all the rows in an index table corresponding to the predicate column of interest in the main table to the global maximum value in the index table (step 306). In an example, the predicate column of interest is a column of data in the main table in which the predicate has not been used as indicated by the corresponding index table. In an embodiment, program 300 adjusts the maximum value in a row of an index table to match the highest value. For example, index table 134 may have values in a row up to 20 (e.g., Max C2 row 1 of index table 134). In this example, program 300 adjusts the max value in the index table to 15 for all the rows in index table 134 corresponding to the column of interest (e.g., index table 134 C2, rows 1-5). Program 300 can then more completely compress the data from the index table because more rows would have the same value.

Program 300 determines if the maximum value for a row in an index table corresponding to a predicate column is close to the global maximum value for all the rows in the index table for the predicate column (decision 308). In an embodiment, program 300 determines if the maximum value for a row in an index table (e.g., index table 134) is within a threshold value to the global maximum value. For example, program 300 determines if the maximum value for a row in index table 134 of 18 is within a threshold value of a global maximum of 20. The threshold value can be preset by a user of program 300 or can be determined by program 300 based on the amount of data entries that may have to be adjusted. If program 300 determines that the global maximum value for the block of data in a main table (e.g., main table 132) is not within a threshold value of a maximum value for a corresponding index table (e.g., index table 134), then program 300 goes to decision 312 (no branch, decision 308).

If program 300 determines that the global maximum value for the block of data in a main table is within a threshold value of a maximum value for a corresponding index table (yes branch, decision 308), then program 300 adjusts the maximum value to the global maximum value (step 310). In an embodiment, program 300 adjusts the maximum value in a row of an index table (e.g., index table 134) to the global maximum value for the corresponding block of data from a main table (e.g., main table 132). For example, the global maximum value in the column is 20; however, a row contains 500 distinct values of which 19 is the maximum value. In this example, program 300 determines that the maximum value in the index is within a threshold value and adjusts the maximum value to 20. In one embodiment, program 300 can then compress the rows of data more completely because more rows will have a maximum value of 20.

Program 300 determines if a frequent and higher maximum value exists in an index table than the maximum value that is not compressed in a row of the index table (decision 312). In an embodiment, program 300 determines whether a frequent and higher maximum value in an index table (e.g., index table 134) that is as close (e.g., one integer difference) to the current uncompressed value in a row of the index table exists. In various embodiments, program 300 may determine that a value is frequent for an index table if the value has been used a preset percentage of times, a user preset amount of times, or an amount of times that program 300 determines would be beneficial for compression in an index table, such as index table 134. In an embodiment, program 300 may determine a frequent and higher maximum value does not exist if the effectiveness of an index table (e.g., index table 134) is reduced. For example, index table 134 is reduced by including a frequent value from main table 132 beyond a threshold with a potential new maximum value. If program 300 determines that a frequent and higher maximum value does not exist, then program 300 goes to end (no branch, decision 312).

If program 300 determines a frequent and higher maximum value exists (yes branch, 312), then program 300 adjusts the maximum value to a frequent and higher maximum value (step 314). In an embodiment, program 300 determines that a frequent and higher maximum value exists in index table 134 for a corresponding block of data which is determined from the compression dictionary. In an example, program 300 adjusts the $3^{rd}$ row for C2 in index table 134 to a value of 20 because a frequent and higher maximum value exists for C2 in index table 134.

In an embodiment, program 300 determines to adjust the maximum value to a suitable higher rounded value. In an example, a rounded value can also be referred to as an intermittent value (e.g., a value that not a maximum value in the row, but rather just a higher value than the identified value within all the values for the row). In this embodiment, when a very large number of distinct values in a column of the main table exists (e.g., column C1 has distinct values from 1 to 100), the maximum value (Max C1) in each row in the index table may vary such that it is not easy to identify the frequent values. In this example, program 300 rounds the maximum value to the closest higher value, which is a multiple of 10 or 20 or more if there is a much higher number of distinct values, which increases the ability to compress the rounded values. For example, if the maximum value in an index table (e.g., index table 134) corresponding to 20 blocks for a column in the main table (e.g., main table 132) are (5, 7, 11, 13, 15, 21, 21, 8, 37, 33, 52, 58, 65, 66, 73, 76, 80, 95, 97, 99), program 300 rounds the values to the next higher value that is a multiple of 10, such as (10, 10, 20, 20, 20, 10, 40, 40, 60, 60, 70, 70, 80, 80, 80, 100, 100, 100). In this example, the repeating values have better compression possibilities without significantly losing the effectiveness of the index table (e.g., index table 134) to eliminate reading blocks of the main table (e.g., main table 132). In an example, if the predicate C1>=66, program 300 may only have to read the one additional block that previously had the maximum value of 65.

Figure 4:
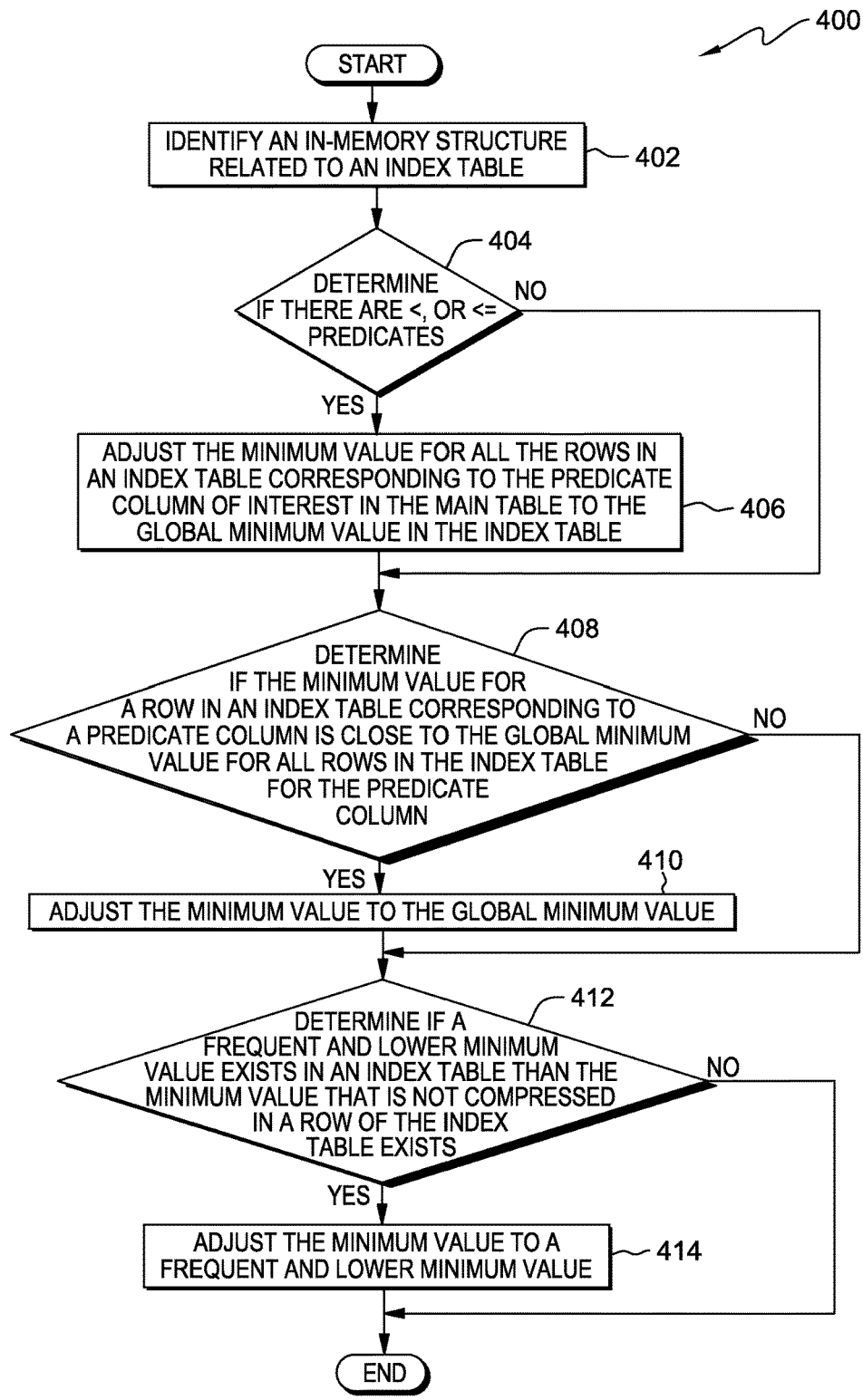
FIG. 4 is a flowchart depicting operational steps of a program for compressing tables containing metadata with minimum values related to large blocks of column data by lossy compression within the distributed data processing environment of FIG. 1, in accordance with an embodiment of the present invention.

FIG. 4 is a flowchart depicting operational steps of program 400, which is a function of compression program 120, in accordance with an embodiment of the present invention. Program 400 operates on server 102 and compresses minimum values in index tables. Program 400 optimizes the storage and read costs of index tables containing rows with a minimum value for corresponding values in a page or block of data in the main table in a relational database system. The method of optimizing storage of the index table is done using statistics maintained by program 200 and making adjustments of the minimum value to get better index table compression using the encoded values in the index table dictionary. In various embodiments, program 400 begins the operational steps of program 400 via a user command, an automatic maintenance agent, a database maintenance policy, or after an update from program 200.

Program 400 identifies an in-memory structure related to an index table (step 402). In an embodiment, program 400 identifies an in-memory structure for an index table (e.g., index table 134) that relates to minimum values of a block of data in the index table. In an example, an in-memory structure may comprise Stuct1 (Pred_Type, Count, Avg_Selectivity) for each column, where the predicate type is <, or <=. Program 400 identifies the use of the minimum values of a block in the index table.

Program 400 determines if there are <, or <= predicates (decision 404). In an embodiment, program 400 determines if there are no <= predicates on a column (e.g., C1<=4) as maintained by program 200 over a configured period of time. If program 400 determines that the minimum value, < or <=, in the index table is used, program 400 goes to decision 408 (no branch, decision 404).

If program 400 determines that the minimum value in a row of the index table is not used (yes branch, decision 404), then program 400 adjusts the minimum value for all the rows in an index table corresponding to the predicate column of interest in the main table to the global minimum value in the index table (step 406). In an embodiment, program 400 adjusts the minimum value in a row of an index table to match the lowest value. For example, index table 134 may have values in a row up to 1 (e.g., Min C2 row 1 of index table 134). In this example, program 400 adjusts the minimum value in the index table to 1 for all the rows in index table 134 corresponding to the column of interest (e.g., index table 134 C2, rows 1-5). Program 400 can then more completely compress the data from the index table because more rows would have the same value.

Program 400 determines if the minimum value for a row in an index table corresponding to a predicate column is close to the global minimum value for all the rows in the index table for the predicate column (decision 408). In an embodiment, program 400 determines if the minimum value for a row in an index table (e.g., index table 134) is within a threshold value to the global minimum value. For example, program 400 determines if the minimum value for a row in index table 134 of 2 is within a threshold value of a global minimum of 1. The threshold value can be preset by a user of program 400 or can be determined by program 400 based on the amount of data entries that may have to be adjusted. If program 400 determines that the global minimum value for the block of data in a main table (e.g., main table 132) is not within a threshold value of a minimum value for a corresponding index table (e.g., index table 134), then program 400 goes to decision 412 (no branch, decision 408).

If program 400 determines that the global minimum value for the block of data in a main table is within a threshold value of a minimum value for a corresponding index table (yes branch, decision 408), then program 400 adjusts the minimum value to the global maximum value (step 410). In an embodiment, program 400 adjusts the minimum value in a row of an index table (e.g., index table 134) to the global minimum value for the corresponding block of data from a main table (e.g., main table 132). For example, the global minimum value in the column is 1; however, a row contains 500 distinct values of which the minimum value is 2. In this example, program 400 determines that the minimum value in the index is within a threshold value and adjusts the minimum value to 1. In one embodiment, program 400 can then compress the rows of data more completely because more rows will have a minimum value of 1.

Program 400 determines if a frequent and lower minimum value exists in an index table than the minimum value that is not compressed in a row of the index table (decision 412). In an embodiment, program 400 determines whether a frequent and lower minimum value in an index table (e.g., index table 134) that is as close (e.g., one integer difference) to the current uncompressed value in a row of the index table exists. In various embodiments, program 400 may determine that a value is frequent for an index table if the value has been used a preset percentage of times, a user preset amount of times, or an amount of times that program 400 determines would be beneficial for compression in an index table, such as index table 134. In an embodiment, program 400 may determine a frequent and lower minimum value does not exist if the effectiveness of an index table (e.g., index table 134) is reduced. For example, index table 134 is reduced by including a frequent value from main table 132 beyond a threshold with a potential new minimum value. If program 400 determines that a frequent and lower minimum value does not exist, then program 400 goes to end (no branch, decision 412).

If program 400 determines a frequent and lower minimum value exists (yes branch, 412), then program 400 adjusts the minimum value to a frequent and lower minimum value (step 414). In an embodiment, program 400 determines that a frequent and lower minimum value exists in index table 134 for a corresponding block of data which is determined from the compression dictionary. In an example, program 400 adjusts the $2^{nd}$ row for C2 in index table 134 to a value of 1 because a frequent and lower minimum value exists for C2 in index table 134 than the value 2 that is not compressed in index table 134.

In an embodiment, program 400 determines to adjust the minimum value to a suitable lower rounded value. In an example, a rounded value can also be referred to as an intermittent value (e.g., a value that not a minimum value in the row, but rather just a lower value than the identified value within all the values for the row). In this embodiment, when a very large number of distinct values in a column of the main table exist (e.g., column C1 has distinct values from 1 to 100), the minimum value (Min C1) in each row in the index table may vary such that it is not easy to identify the frequent values. In this example, program 400 rounds the minimum value to the closest lower value that is a multiple of 10 or 20 or more if there is a much higher number of distinct values, which increases the ability to compress the rounded values. For example, if the minimum value in an index table (e.g., index table 134) corresponding to 20 blocks for a column in the main table (e.g., main table 132) are (5, 7, 11, 13, 15, 21, 21, 8, 37, 33, 52, 58, 65, 66, 73, 76, 80, 95, 97, 99), program 400 rounds the values to the previous lower value that is multiple of 10, such as (0, 0, 10, 10, 10, 0, 30, 30, 50, 50, 60, 60, 70, 70, 70, 90, 90, 90). In this example, the repeating values have better compression possibilities without significantly losing the effectiveness of the index table (e.g., index table 134) to eliminate reading blocks of the main table (e.g., main table 132). In an example, if the predicate C1>=66, program 400 may only have to read the two additional blocks that previously had the maximum value of 65 and 66.

Figure 5:
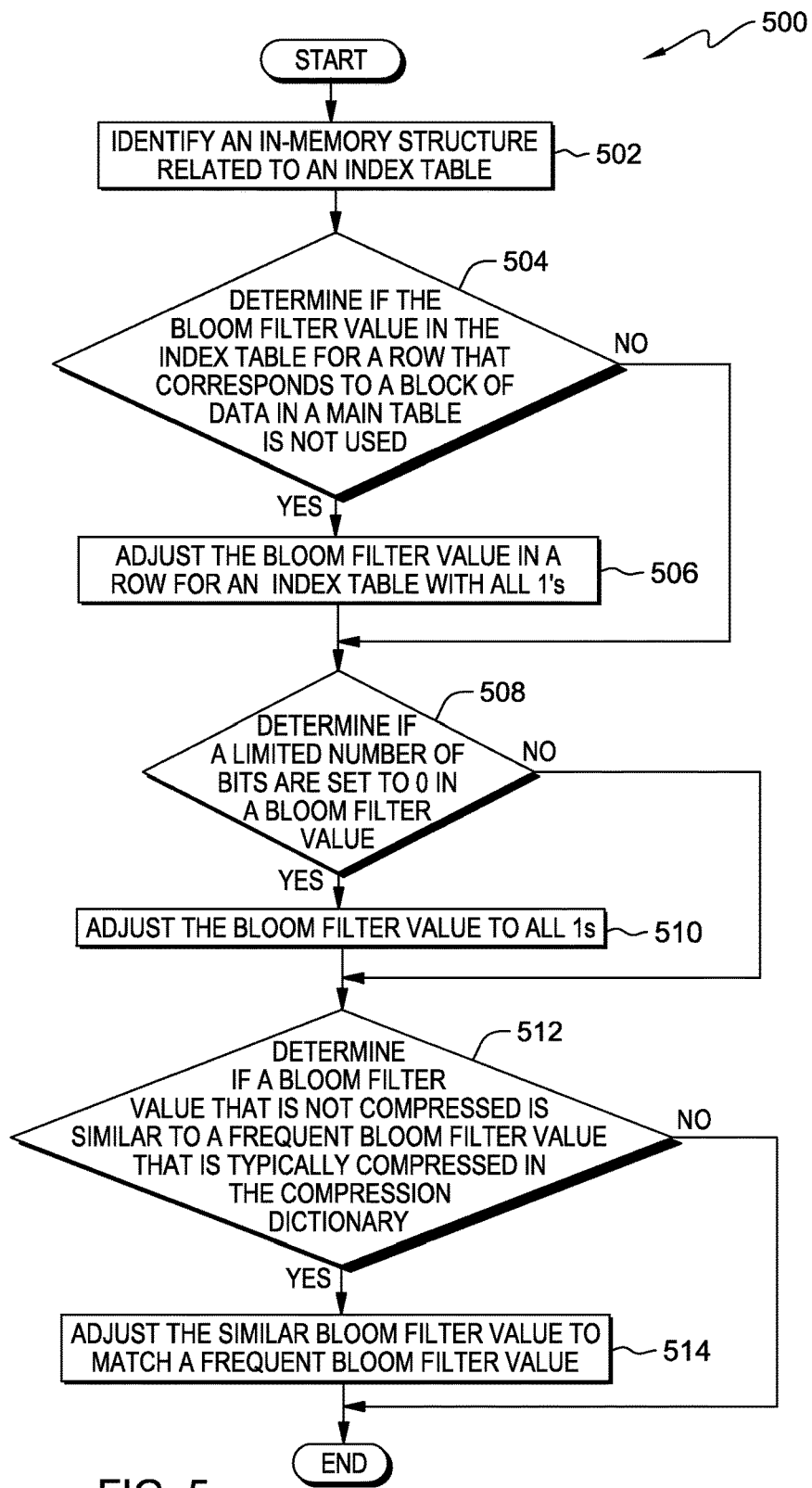
FIG. 5 is a flowchart depicting operational steps of a program for compressing tables containing metadata with Bloom values related to large blocks of column data with minimum values by lossy compression within the distributed data processing environment of FIG. 1, in accordance with an embodiment of the present invention.

FIG. 5 is a flowchart depicting operational steps of program 500, which is a function of compression program 120, in accordance with an embodiment of the present invention. Program 500 operates on server 102 and compresses Bloom filter values on index tables. Program 500 optimizes the storage and read costs of index tables containing rows with a Bloom filter value for corresponding values in a page or block of data in the main table in a relational database system. The method of optimizing storage of the index table is performed using statistics maintained by program 200 and making adjustments of the Bloom filter value to get better index table compression using the encoded values in the index table dictionary. In various embodiments, program 500 begins the operational steps of program 500 via a user command, an automatic maintenance agent, a database maintenance policy, or after an update from program 200.

Program 500 identifies an in-memory structure related to an index table (step 502). In an embodiment, program 500 identifies an in-memory structure for an index table (e.g., index table 134) that relates to Bloom filter values of a block of data in the index table. In an example, an in-memory structure may comprise Stuct1 (Pred_Type, Count, Avg_Selectivity) for each column, where the predicate type is =. In an embodiment, program 500 identifies Bloom filter values as the column of interest in the index table corresponding to the predicate column.

Program 500 determines if the Bloom filter value in the index table for a row that corresponds to a page or block of data in a main table is not used (decision 504). In an embodiment, program 500 determines if the Bloom filter value in a row on an index table (e.g., index table 134) is not used by a database system based on program 200 that monitors queries over time. In one embodiment, after one week, program 200 may determine that the Bloom value for a column in the index table is not used. In one embodiment, the period of time is preset by a user. In various embodiments, program 200 constantly monitors query and keeps statistics of whether there are equality predicates on a column. If program 500 determines that the Bloom filter value in the index table is used, program 500 goes to decision 508 (no branch 504).

If program 500 determines that the Bloom filter value in a row of the index table is not used (yes branch, decision 504), then program 500 adjusts the Bloom filter value in the row for index table to all 1's (step 506). For example, index table 134 may have Bloom filter values in a row that have not been utilized (e.g., Bloom C2 row 1 of index table 134 of FIG. 6), (10011110). In this example, program 500 adjusts the Bloom filter value in the index table to (11111111) for the identified row. In an embodiment, program 500 may adjust the Bloom filter value for each row in the index table that corresponds to the page or block of data in which there was no query for the Bloom value (e.g., index table 134 C2, rows 1-5 of FIG. 6). Program 500 can then more completely compress the data from the index table because more rows would have the same value.

Program 500 determines if a limited number of bits are set to 0 in a Bloom filter value (decision 508). In an embodiment, program 500 determines the number of bits set to 0 is limited based upon a percentage of bits in the Bloom filter (e.g., 10% of bits set to 0). For example, if 32 bits for each Bloom filter value exist, program 500 may only change up to 3 bits from 0 to 1. In another embodiment, program 500 determines if the number of bits set to 0 is limited based upon a preset number of bits that program 500 can change. In an example, program 500 can only change two bits from 0 to 1 for any given Bloom filter value regardless of the number of bits in the Bloom filter value. If program 500 determines that the number of bits is set to 0 in a Bloom filter value and is not within a limit, then program 500 goes to decision 512 (no branch, decision 508).

If program 500 determines that a limited number of bits is set to 0 in a Bloom filter value (yes branch, decision 508), then program 500 adjusts the Bloom filter value to set all bits to 1's (step 510). In an embodiment, program 500 adjusts Bloom filter values in index table 134 to all bits to 1's for values that have a limited number of bits set to 0. For example, the Bloom filter value in index table 134 C2, row 3 of FIG. 6 is (01111111). In this example, only one bit is set to 0; therefore, program 500 sets the 0 to a 1, and the new Bloom value is (11111111). Program 500 adjusts Bloom filter values to 1's that have a limited number of 0's for rows in the index table to increase the number of Bloom filter values that are represented as all 1's; and therefore, increase compression capabilities.

Program 500 determines if a Bloom filter value that is not compressed is similar to a frequent Bloom filter value that is typically compressed and in the compression dictionary (decision 512). In an embodiment, program 500 determines if a Bloom filter value for a row in an index table (e.g., index table 134) is similar to a frequent Bloom filter value of an index table (e.g., index table 134). For example, if a frequent Bloom filter value is (11001100), program 500 would determine if other Bloom filter values are similar based on how many bits are different. In one embodiment, program 500 determines if a frequent value is subsumed by the bits set to one in a second bloom filter value. In an embodiment, program 500 determines that a Bloom filter value is frequent based on the number of times the Bloom filter value appears in an index table (e.g., index table 134). In an example, program 500 determines that a Bloom filter value is frequent because the Bloom filter value appears as 10 percent of the Bloom filter values in an index table. In one embodiment, program 500 measures the similarity utilizing the percentage of bits that are set to 1 and are in the same location. In an example, a frequent Bloom filter value has 32 bits, which are a combination of 1's and 0's. If another Bloom filter value has 90 percent of the same bits set to 1, then program 500 determines that the Bloom filter values are similar. In another embodiment, program 500 may have a particular number of bits that have to be similar. In an example, program 500 determines that 30 of the 32 bits for a frequent Bloom filter value match a Bloom filter value in index table 134. If program 500 determines that a Bloom filter value is not similar to a frequent Bloom filter value (no branch, decision 512), then program 500 goes to end.

If program 500 determines that a Bloom filter value similar to a frequent Bloom filter value that has 1's covering all the bits set to 1 in the uncompressed less frequent Bloom filter pattern (yes branch, decision 512), then program 500 adjusts the similar Bloom filter value to match a frequent Bloom filter value (step 514). In an embodiment, program 500 adjusts the Bloom filter value in a row of an index table (e.g., index table 134) to match a frequent Bloom filter value. In an example, row 2 of C1 in index table 134 of FIG. 6 is (01001010). If program 500 determines that this Bloom filter value is a frequent Bloom filter value in index table 134, then program 500 may also determine that the value (00001010) for row 3 for C1 in index table 134 FIG. 6 is similar. Program 500 changes the second bit from a 0 to a 1, which then creates more Bloom filter values that are identical in index table 134, which leads to better compression. In an embodiment, a bit in an index table (e.g., index table 134) is not changed from 0 to 1 by program 500 if program 500 determines the bit corresponds to a high frequent value beyond a threshold in a corresponding main table (e.g., 132) as a value beyond the threshold value reduces the effectiveness of the bloom filter. In one embodiment, the determination of overlap of the bits that are set to 1 needs to be a large percentage so that the index table is still very effective after the adjustment.

Figure 7:
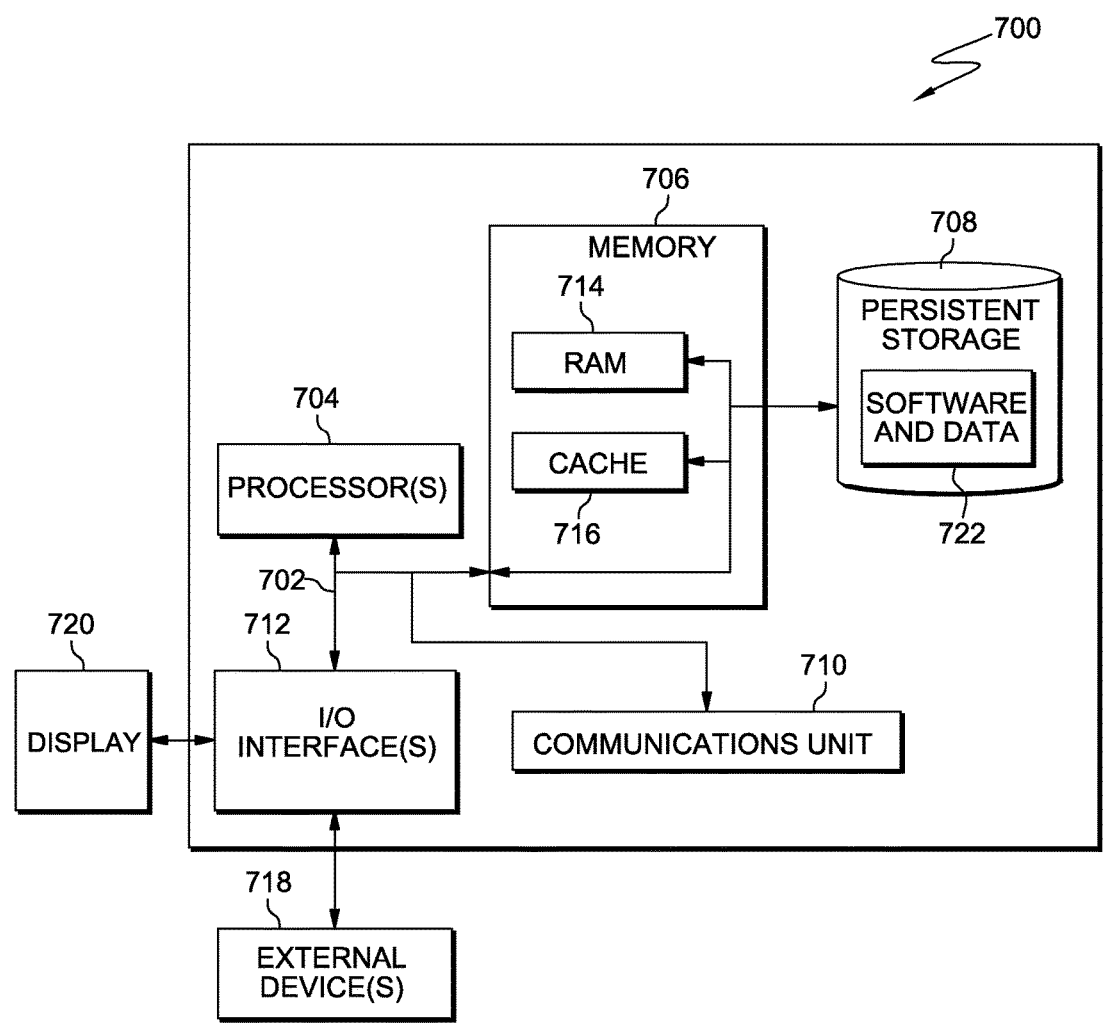
FIG. 7 depicts a block diagram of components of a server and client devices of FIG. 1, in accordance with an embodiment of the present invention.

FIG. 7 depicts a block diagram of components of computer 700, which is representative of server 102, in accordance with an illustrative embodiment of the present invention. It should be appreciated that FIG. 7 provides only an illustration of one implementation and does not imply any limitations with regard to the environments in which different embodiments may be implemented. Many modifications to the depicted environment may be made.

Computer 700 includes communications fabric 702, which provides communications between computer processor(s) 704, memory 706, persistent storage 708, communications unit 710, and input/output (I/O) interface(s) 712. Communications fabric 702 can be implemented with any architecture designed for passing data and/or control information between processors (such as microprocessors, communications, and network processors, etc.), system memory, peripheral devices, and any other hardware components within a system. For example, communications fabric 702 can be implemented with one or more buses.

Memory 706 and persistent storage 708 are computer readable storage media. In this embodiment, memory 706 includes random access memory (RAM) 714 and cache memory 716. In general, memory 706 can include any suitable volatile or non-volatile computer readable storage media. Software and data 722 are stored in persistent storage 708 for access and/or execution by processor(s) 704 via one or more memories of memory 706. With respect to server 102, software and data 722 represents compression program 120 and database 130.

In this embodiment, persistent storage 708 includes a magnetic hard disk drive. Alternatively, or in addition to a magnetic hard disk drive, persistent storage 708 can include a solid-state hard drive, a semiconductor storage device, a read-only memory (ROM), an erasable programmable read-only memory (EPROM), a flash memory, or any other computer readable storage media that is capable of storing program instructions or digital information.

The media used by persistent storage 708 may also be removable. For example, a removable hard drive may be used for persistent storage 708. Other examples include optical and magnetic disks, thumb drives, and smart cards that are inserted into a drive for transfer onto another computer readable storage medium that is also part of persistent storage 708.

Communications unit 710, in these examples, provides for communications with other data processing systems or devices. In these examples, communications unit 710 includes one or more network interface cards. Communications unit 710 may provide communications through the use of either or both physical and wireless communications links. Software and data 722 may be downloaded to persistent storage 708 through communications unit 710.

I/O interface(s) 712 allows for input and output of data with other devices that may be connected to computer 700. For example, I/O interface(s) 712 may provide a connection to external device(s) 718 such as a keyboard, a keypad, a touch screen, and/or some other suitable input device. External device(s) 718 can also include portable computer readable storage media such as, for example, thumb drives, portable optical or magnetic disks, and memory cards. Software and data 722 can be stored on such portable computer readable storage media and can be loaded onto persistent storage 708 via I/O interface(s) 712. I/O interface(s) 712 also connect to a display 720.

Display 720 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for adjusting metadata in tables, the method comprising:

identifying, by one or more computer processors, at least one of a first minimum value, a first maximum value, and a first Bloom filter value for a row of data in a metadata table, wherein the metadata table contains metadata corresponding to a row of data in a main table;

identifying, by one or more computer processors, at least one of a second minimum value that is a lower value than the first minimum value, a second maximum value that is higher than the first maximum value, and a second Bloom filter value for a row of data in the metadata table, wherein the second values are frequent values in the metadata table; and adjusting, by one or more computer processors, at least one of the identified first minimum value to the second frequent and lower minimum value in the metadata table, the identified first maximum value to the second frequent and higher maximum value in the metadata table, and the identified first Bloom filter value to the second frequent Bloom filter value in the metadata table, wherein adjusting the metadata table compresses the metadata table.

2. The method of claim 1, wherein adjusting at least one of the identified first minimum value to the second frequent and lower minimum value in the metadata table, the identified first maximum value to the second frequent and higher maximum value comprises:

identifying, by one or more computer processors, at least one of a global minimum value for all rows of the metadata table and a global maximum value for all rows of the metadata table;

determining, by one or more computer processors, whether at least one of the identified first minimum value and the identified first maximum value is within a threshold number of the corresponding instance of the identified global minimum value and the identified global maximum value; and in response to determining that at least one of the identified first minimum value and the identified first maximum value is within a threshold number of the corresponding instance of the identified global minimum value and the identified global maximum value, adjusting, by one or more computer processors, at least one of the identified first minimum value and the identified first maximum value to the identified global minimum value and the identified global maximum value.

3. The method of claim 1, wherein adjusting at least one of the identified first minimum value to the second frequent and lower minimum value in the metadata table, the identified first maximum value to the second frequent and higher maximum value comprises:

identifying, by one or more computer processors, at least one of a lower minimum value than the first identified minimum value that meets a threshold number of occurrences in the metadata table and a higher maximum value than the first identified maximum value that meets a threshold number of occurrences in the metadata table;

determining, by one or more computer processors, whether at least one of the identified first minimum value and the identified first maximum value is within a threshold number of the corresponding instance of the identified lower minimum value and the identified higher maximum value; and in response to determining that at least one of the identified first minimum value and the identified first maximum value is within a threshold number of the corresponding instance of the identified lower minimum value and the identified higher maximum value, adjusting, by one or more computer processors, at least one of the identified first minimum value and the identified first maximum value to the corresponding instance of the identified lower minimum value and the identified higher maximum value.

4. The method of claim 1, wherein adjusting at least one of the identified first minimum value to the second frequent and lower minimum value in the metadata table, the identified first maximum value to the second frequent and higher maximum value comprises:

identifying, by one or more computer processors, at least one of an intermittent value within a threshold number of the identified first minimum value and an intermittent value within a threshold number of the identified first maximum value, wherein the intermittent value is between the identified minimum value for the row of data in the metadata table and the identified maximum value for the row of data in the metadata table; and adjusting, by one or more computer processors, at least one of the first minimum value to the identified intermittent value, and the first maximum value to the identified intermittent value.

5. The method of claim 1, wherein adjusting at least one of the identified first minimum value to the second frequent and lower minimum value in the metadata table, the identified first maximum value to the second frequent and higher maximum value in the metadata table, and the identified first Bloom filter value to the second frequent Bloom filter value comprises:

generating, by one or more computer processors, an in-memory structure, wherein the in-memory structure corresponds to a column of data in the main table and corresponding metadata from the metadata table, and wherein the in-memory structure monitors at least one of a number of times a predicate is used, a type of predicate used, and a frequency of use of the metadata table for a predicate in the corresponding main table; and in response to generating an in-memory structure, adjusting, by one or more computer processors, at least one of the identified first minimum value, the identified first maximum value, and the identified Bloom filter value based upon at least one of the number of times a predicate is used, the type of predicate used, and the frequency of use of the metadata table for a predicated in the corresponding main table.

6. The method of claim 1, wherein adjusting at least one of the identified first minimum value to the second frequent and lower minimum value in the metadata table, the identified first maximum value to the second frequent and higher maximum value in the metadata table, and the identified first Bloom filter value to the second frequent Bloom filter value comprises:

determining, by one or more computer processors, whether a number of bits, which are set to zero in the identified first Bloom filter value, is within a threshold number of bits; and in response to determining that a number of bits, which are set to zero in the identified first Bloom filter value, is within a threshold number of bits, adjusting, by one or more computer processors, all zero bits for the identified first Bloom filter value to one.

7. The method of claim 1, wherein adjusting at least one of the identified first minimum value to the second frequent and lower minimum value in the metadata table, the identified first maximum value to the second frequent and higher maximum value in the metadata table, and the identified first Bloom filter value to the second frequent Bloom filter value comprises:

identifying, by one or more computer processors, a frequent Bloom filter value in the metadata table, wherein a frequent Bloom filter value is above a threshold number of occurrences;

determining, by one or more computer processors, whether a number of bits which are set to zero in the identified first Bloom filter value is within a threshold number of bits; and in response to determining that a number of bits, which are set to zero in the identified first Bloom filter value, is within a threshold number of bits, adjusting, by one or more computer processors, zero bits for the identified first Bloom filter value to one bits to match the identified frequent Bloom filter value.

8. The method of claim 1, wherein adjusting at least one of the identified first minimum value to the second frequent and lower minimum value in the metadata table, the identified first maximum value to the second frequent and higher maximum value in the metadata table, and the identified first Bloom filter value to the second frequent Bloom filter value comprises:

identifying, by one or more computer processors, a frequent Bloom filter value in the metadata table, wherein a frequent Bloom filter value is above a threshold number of occurrences and subsumed by the bits set to one in the second bloom filter value;

determining, by one or more computer processors, whether a number of bits, which are set to one in the identified first Bloom filter value, is within a threshold number of bits; and in response to determining that a number of bits, which are set to one in the identified first Bloom filter value, is within a threshold number of bits, adjusting, by one or more computer processors, zero bits for the identified first Bloom filter value to one bits to match the identified frequent Bloom filter value.

9. A method for compressing metadata in tables, the method comprising:

identifying, by one or more computer processors, at least one of a minimum value, a maximum value, and a Bloom filter value for a row of data in a metadata table, wherein the metadata table contains metadata corresponding to a row of data in a main table;

generating, by one or more computer processors, an in-memory structure, wherein the in-memory structure corresponds to a column of data in the main table and corresponding metadata from the metadata table, and wherein the in-memory structure monitors at least one of a number of times a predicate is used, a type of predicate used, and a frequency of use of the metadata table for a predicate in the corresponding main table;

identifying, by one or more computer processors, at least one of a second minimum value that is a lower value than the first minimum value, a second maximum value that is higher than the first maximum value, and a second Bloom filter value for a row of data in the metadata table, wherein the second values are frequent values in the metadata table; and adjusting, by one or more computer processors, at least one of the identified first minimum value to the second frequent and lower minimum value in the metadata table, the identified first maximum value to the second frequent and higher maximum value in the metadata table, and the identified first Bloom filter value to the second frequent Bloom filter value in the metadata table, wherein adjusting the metadata table compresses the metadata table.

* * * * *